United States Patent
Takahashi

(10) Patent No.: US 6,212,615 B1
(45) Date of Patent: Apr. 3, 2001

(54) SEMICONDUCTOR CIRCUIT HAVING BURST COUNTER CIRCUIT WHICH IS REDUCED THE CIRCUITS PASSING FROM THE CLOCK INPUT TERMINAL TO OUTPUT TERMINAL

(75) Inventor: Hiroyuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/989,869

(22) Filed: Dec. 12, 1997

(30) Foreign Application Priority Data

Dec. 19, 1996 (JP) .................................................. 8-339646

(51) Int. Cl.[7] .................................................. G06F 12/02
(52) U.S. Cl. ........................ 711/219; 711/217; 711/218; 365/189.02; 365/189.12; 365/230.02; 365/230.08
(58) Field of Search ..................................... 711/217, 218, 711/219, 109, 110, 157; 365/189.02, 189.12, 230.02, 230.06, 230.08

(56) References Cited

U.S. PATENT DOCUMENTS 5,345,573 * 9/1994 Bowden, III et al. ............... 711/217
5,729,709 * 3/1998 Harness ................................... 711/5
5,737,269 * 4/1998 Fujita ..................................... 365/200
5,835,970 * 11/1998 Landry et al. ........................ 711/218

FOREIGN PATENT DOCUMENTS 58-150184   9/1983  (JP) .

* cited by examiner

Primary Examiner—Hiep T. Nguyen
(74) Attorney, Agent, or Firm—Sughrue, Mion, Zinn, Macpeak & Seas, PLLC

(57) ABSTRACT

A semiconductor circuit of the present invention comprises, a decoder responding a plurality of address signals to produce a plurality of decoded address signals, a plurality of switch circuits receiving the respective decoded address signals, each switch circuits outputting an output signal, a plurality of registers receiving the respective output signals, each registers outputting a latched output signal, and supplying the latched output signal to the switch circuits except the switch circuit corresponding to that particular latched output signal, and a control circuit generating a control signal in response to a part of the address signal, the switch circuit outputting one of the decoded address signal and the latched output signal as said output signal according to the control signal.

27 Claims, 9 Drawing Sheets

SEMICONDUCTOR CIRCUIT HAVING BURST COUNTER CIRCUIT WHICH IS REDUCED THE CIRCUITS PASSING FROM THE CLOCK INPUT TERMINAL TO OUTPUT TERMINAL

BACKGROUND OF THE INVENTION

The present invention relates to a semiconductor circuit, and particularly to a burst address generating circuit of a synchronous memory circuit with a burst transfer function.

As a high speed data transfer system following an operation speed of a CPU for making a high-performance computer system, there is a burst data transfer system. This is a system in which after a base address is given to a synchronous memory, addresses are automatically generated in the memory by a clock signal (abbreviated "CLK"), so that data is outputted at high speed. An address sequence for generation of a burst signal is different according to a system in which a memory is used.

At present, as a high speed memory equipped with a burst function, there is a synchronous static random access memory (abbreviated "SSRAM") which is used as a cache memory, and an interleave system is used as a burst sequence. Table 1 shows the sequence.

TABLE 1

| External input address | Add0 | Add1 | Add2 | — | — |
|---|---|---|---|---|---|
| First burst address | $\overline{Add0}$ | Add1 | Add2 | — | — |
| Second burst address | Add0 | $\overline{Add1}$ | Add2 | — | — |
| Third burst address | $\overline{Add0}$ | $\overline{Add1}$ | Add2 | — | — |

In this case, two bits of Add0 and Add1 of the least significant bit constitute a burst address, and on the basis of an external input address, only the address Add0 is changed to the reverse phase in the first burst cycle, only the address Add1 is changed to the reverse phase in the second burst cycle, and both of address Add0 and Add1 are changed to the reverse phase in the third burst cycle, while the address Add2 and the following hold the data as they are in the burst cycles. A circuit for realizing this operation will be hereinafter described.

FIG. 1 shows a first example of a conventional circuit. Burst address Add0 and Add1 are inputted into register circuits RG, respectively. The register circuit RG acquires the burst address Add0 and add1 at a rising edge of a control clock signal EK and outputs the burst address. The register circuit RG holds the output data until a next clock edge of the control clock signal EK receives. The output is changed to positive/negative operation signals by an inverter circuit, and either one is selected by a multiplexer MUX0 into internal address information A0. The information A0 and its inverse information $\overline{A0}$ as its inverted signal are inputted into a decoder DEC1, and in this case, one of output signals B1 through B4 is selected as a ¼ selection signal. The control clock signal EK for controlling the register RG is generated by an AND logic circuit EKB of an internal clock signal K synchronous with an external input clock signal CLK and a base address acquisition mode signal E from the outside. The internal control signal K and the mode signal E are also simultaneously inputted into an address logic control circuit BCC0 at a burst time, and when the mode signal E is low in the burst, the circuit controls and switches the multiplexer MUX0 synchronously with the internal clock signal K. The address logic control circuit BCC0 is constructed as a counter circuit for generating a signal to invert the address Add0 for every cycle of the internal clock signal K, and a signal to invert the address Add1 for every two cycles thereof.

The operation will now be described. Since the mode signal E becomes high at the input of an external address, the signal EK alters like the internal clock signal K, so that the data Add is acquired synchronously with the internal clock signal K. At this time, since the multiplexer MUX0 is fixed and allows the positive logic to path, the address Add0 is inputted into the decoder DEC1 with its logic unchanged. Since the mode signal E becomes low at the generation of the burst address, the control clock signal EK is fixed at low, the register RG outputs the final data held at the external address input before the burst. At the same time, since the circuit BCC0 generates a switching signal for the multiplexer MUX0 synchronously with the internal clock signal K, the burst cycle can be realized in which inverted address Add0 or inverted address Add1 with respect to the base address of Add0 and Add1 is generated in the interleave sequence.

Next, a second conventional example in which a decoder circuit is placed in front of an input register so that a burst signal is generated after completion of ¼ selection by the decoder circuit, will be described. Four select signals B1 through B4 are produced by decoding the address Add0 and Add1 and one select signal is selected among the four select signals B1 to B4. The selection of selected signals is as shown in Table 2 in the burst sequence of the interleave mode. For example, in the case where both of the address Add0 and Add1 are low, the signal B1 is selected at the external input cycle, and at the burst cycles subsequent thereto, the signals B2, B3 and B4 are sequentially selected.

TABLE 2

| External input | Add0, Add1 | 0,0 | 1,0 | 0,1 | 1,1 |
|---|---|---|---|---|---|
| External input | Selected signal | B1 | B2 | B3 | B4 |
| First burst | Selected signal | B2 | B1 | B4 | B3 |
| Second burst | Selected signal | B3 | B4 | B1 | B2 |
| Third Burst | Selected signal | B4 | B3 | B2 | B1 |

FIG. 2 shows an example of a conventional circuit for realizing this burst counter circuit. There are four NOR decoder circuits DEC1 with inputs of positive/negative signal A0 or inverted A0, and signal A1 or inverted A1 of each of the address Add0 and Add1, and their outputs X1 through X4 are respectively inputted into registers RG. Like the first conventional example, a signal EK for controlling the registers RG is generated by an AND logic circuit EKB of a base address acquisition mode signal E and an internal clock signal K. The outputs E1 through E4 of the register circuits RG are outputted as signals B1 to B4 through multiplexers MUX into an internal circuit, and at the same time, are inputted into second register circuits RG1 with the signal K. Outputs B1R to B4R of these register circuits RG1 inputted to the multiplexers on other paths. For example, the multiplexer MUX with input of the output signal E2 has other two inputs of the signals B1R and B3R, and a switching signal flux BC for the inputs is composed of signals FB, RB and EB. The signal flux BC of a circuit BCC2 is composed of the signal FB of an OR logic output of the signals E1 and E2, the signal RB of an OR logic output of the signals E2 and E4, and the signal EB of the same logic as the signal E.

The operation of this circuit will be described. One of decode signal outputs X1 through X4 corresponding to two addresses becomes high and is selected, and the others are low to be in non-selected state and are inputted into the registers RG. For example, when the signal X1 is selected and the signal E becomes high at external address acquisition, the signal EK is inputted into the register RG synchronously with a rising edge of the clock signal K, and the registers acquire the data of the signals X1 through X4. At the same time, the data is outputted as the signals E1 through E4. Since the signal EB is high, the multiplexer MUX is changed so that the signal E1 is outputted as the signal B1 as it is. The signal B1 is transferred to an internal memory circuit such as a next stage decoder. Next, when the burst mode is established, the signal E becomes low, and the signal EK is fixed at low and does not alter, so that the signals E1 through E4 as input register data are fixed. Since the signal E1 is selected and is high, the signal FB becomes high, and the signals RB and EB become low, so that the multiplexer MUX changes selection to the feedback signal (signal B4R for signal E1) from an adjacent path. The data of the signals B1 through B4 in the previous cycle is received into the burst counter register RG1 by the clock signal K, and at the same time, the data is outputted as the signals B1R through B4R, so that this signal is outputted to B1 through B4 through the multiplexer on an adjacent path. In the case where the initial state at external address acquisition is in the selection of the signal E1 or E3, the multiplexer MUX is switched by the signal FB so that a forward direction shift is carried out such that the signal B1 is shifted to the signal B2, and the signal B2 is shifted to the signal B3. In the case where the initial state at external address acquisition is in the selection of the signal E2 or E4, the multiplexer MUX is switched by the signal RB so that a reverse direction shift is carried out such that the signal B1 is shifted to the signal B4, and the signal B2 is shifted to the signal B1. The shift sequence in the burst mode is expressed by forward circulation and reverse circulation as shown in FIG. 3, and the sequence of the burst counter shown in Table 2 is realized as requested.

In the first conventional circuit described above, after the register RG, the multiplexer MUX for a burst counter is disposed, and further, the decoder is disposed thereafter so that the signals B1 through B4 are outputted through the decoder. In the case of a synchronous memory in which the internal state starts to alter synchronously with the external clock, it is necessary to increase the speed of paths for the signal K to the signals B1 through B4. However, in this example, since the multiplexer MUX and the decoder are placed after the register RG, a delay time at that portions is seen as delay. The second conventional example improves this deficiency. The portion of the decoder is moved to the front of the input register, and after the register RG, the signal is outputted through only the multiplexer MUX, so that the speed is increased by the degree of delay of the decoder. However, since the forward circulation and the reverse circulation must be controlled by data of the output signals E1 through E4 of the register RG, the load is increased by the signal extension to the control circuit BCC2. Further, the delay at the portion of the multiplexers MUX remains. Moreover, the registers RG1 for storing the burst data are required for each of the four paths, so that the circuit scale becomes extremely large.

Another problem to hinder the increase of speed is that since the logic buffer EKB for generating the signal EK inputted into the input registers is required, the delay at this portion also occurs at the external address acquisition, which is a problem common to the first and second conventional examples.

SUMMARY OF THE INVENTION

It is therefore an object of the present invention to provide a semiconductor circuit having a burst counter circuit reducing the delay from the input of the clock signal to the output of the burst address.

It is another object of the present invention to provide a semiconductor circuit having a burst counter circuit reducing size thereof.

A semiconductor circuit of the present invention comprises a decoder responding to a plurality of address signals to produce a plurality of decoded address signals, a register receiving the decoded address signals, a switch circuit receiving the decoded address signals and shifting the decoded address signals in response to a control signal to produce shifted decoded address signal, and a control circuit for generating the control signal in response to a part of the address signal.

A semiconductor circuit of another embodiment of the present invention comprises, a decoder responding a plurality of address signals to produce a plurality of decoded address signals, a plurality of switch circuits receiving the respective decoded address signals, each switch circuits outputting an output signal, a plurality of registers receiving the respective output signals, each registers outputting a latched output signal, and supplying the latched output signal to the switch circuits except the switch circuit corresponding to that particular latch signal, and a control circuit generating a control signal in response to a part of the address signal, the switch circuit outputting one of the decoded address signal and the latched output signal as said output signal according to the control signal.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
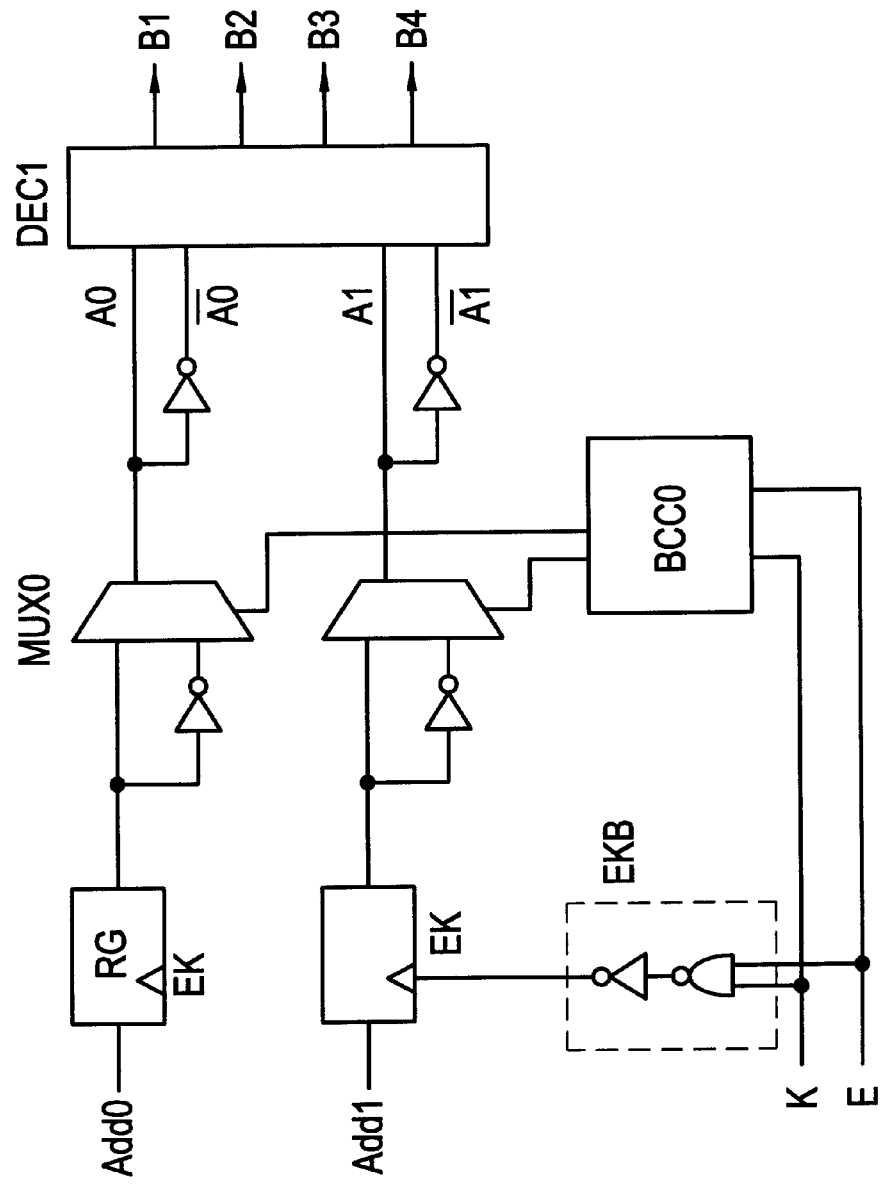
FIG. 1 is a view of a burst counter showing a first conventional example.
Figure 2:
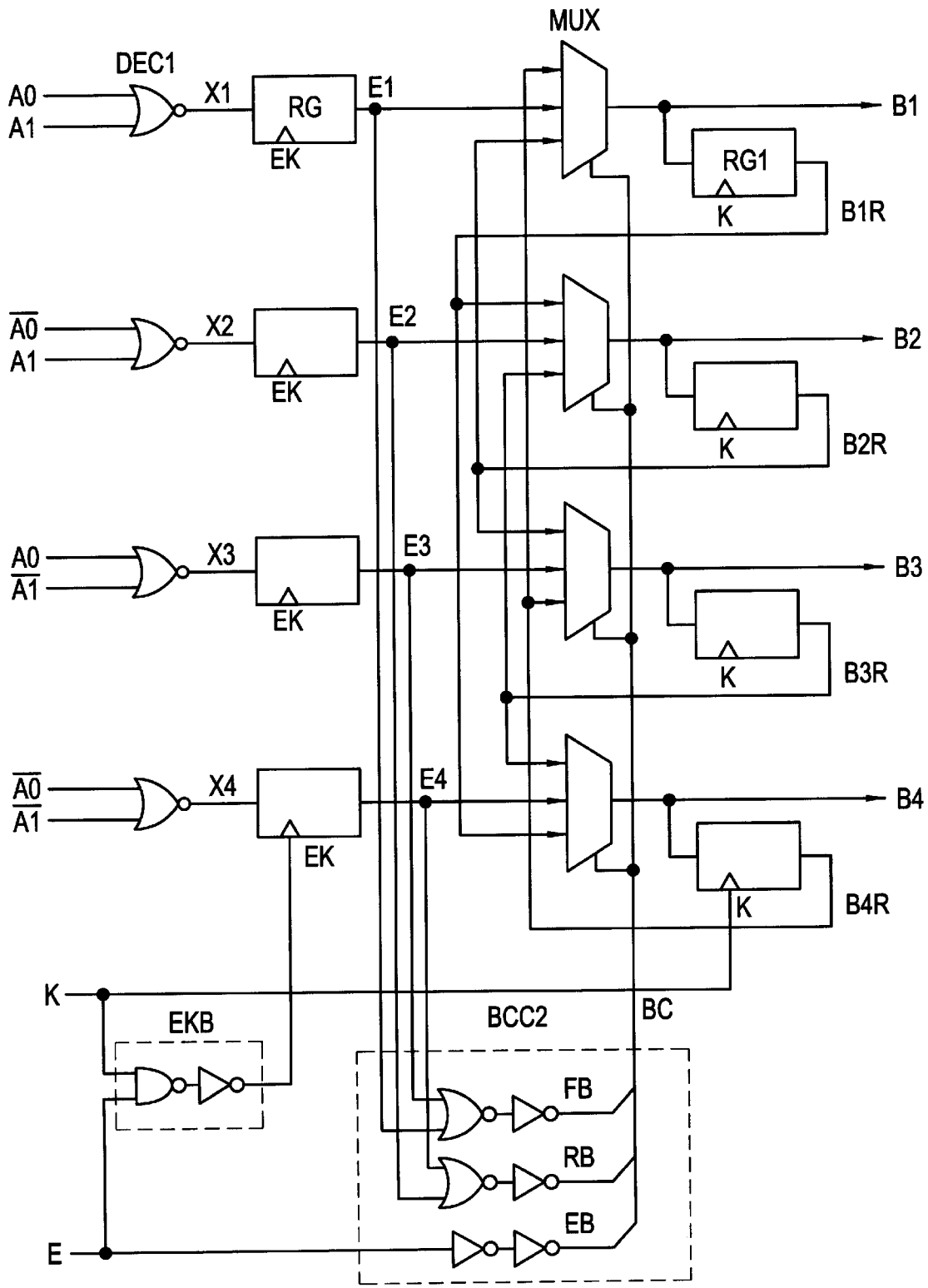
FIG. 2 is a view of a burst counter showing a second conventional example.
Figure 3:
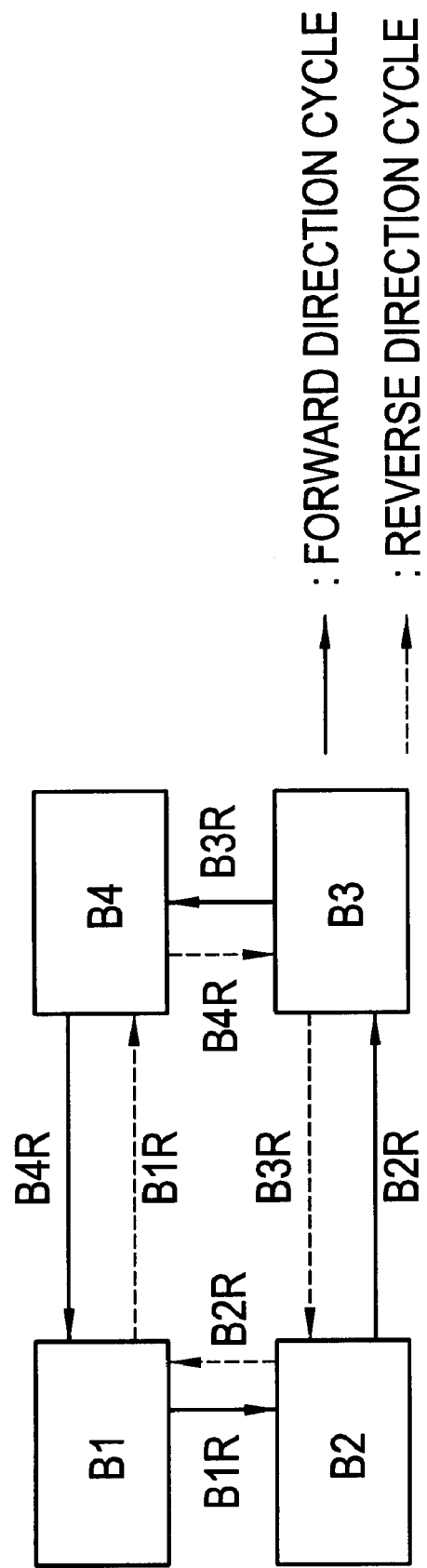
FIG. 3 is a flow diagram of a signal transmission for the burst sequence of the decode output.
Figure 4:
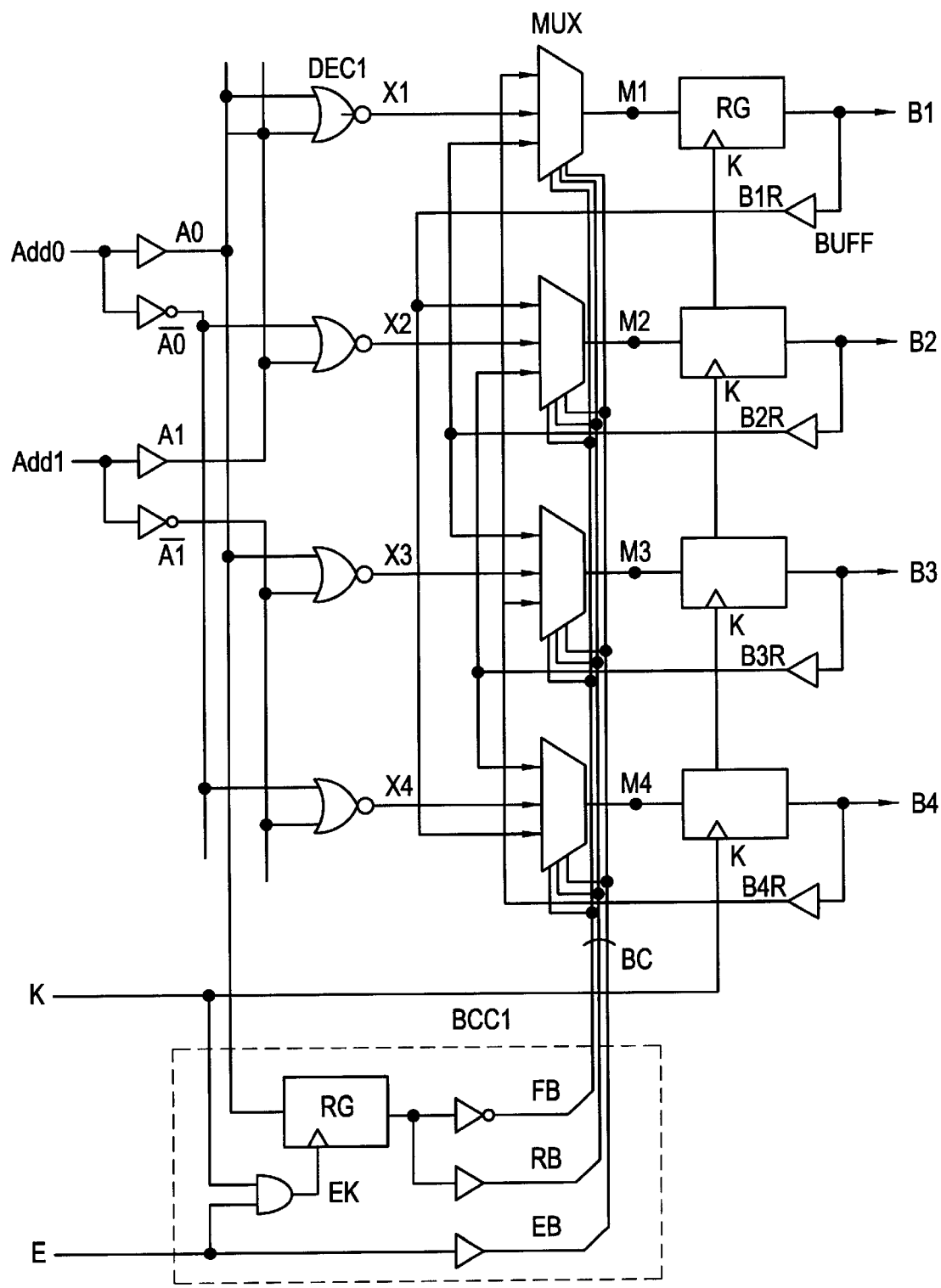
FIG. 4 is a view of a burst counter circuit of a first embodiment of the present invention.

A first embodiment will now be described with reference to FIG. 4. There are four NOR logic circuits DEC1 with input of positive-negative signal A0 and inverted A0, and A1 and inverted A1 of each of address Add0 and Add1. The outputs X1 through X4 are inputted into the respective multiplexers MUX, the outputs M1 through M4 are inputted into registers RG, and the outputs B1 through B4 are transferred to an internal memory circuit. Here, an internal clock signal K synchronous with an external clock controls the registers RG. Three data inputs to the multiplexer MUX is composed of, for example, for a B1 path, in addition to a path of the signal X1 from the decoder, feedback paths of the signals B4R and B2R from the outputs B4 and B2 through buffers. The group of switching signals for these three kinds of input data is a signal BC, which is composed of three signals of a signal FB, signal RB and signal EB. A control circuit BCC1 generates the signal BC, and is comprised of a register for acquiring the address signal A0 before being decoded, an AND logic buffer circuit with inputs of the signals K and E and for generating a clock signal EK for controlling the register, a buffer circuit for outputting the inverted signal FB of the register and the same phase signal RB, and a buffer circuit for outputting the external address acquisition signal E as the same phase signal EB.

The operation will next be described. Among the decode signal outputs X1 through X4 corresponding to the two addresses, one becomes high and is selected, and the others are low to be in a non-selected state and are inputted into the multiplexers MUX. For example, when both the addresses Add0 and Add1 are low and the signal X1 is selected, and when the signal E becomes high at the external address acquisition, the signal EK is generated in the circuit BCC1 synchronously with a rising edge of the signal K, and is inputted into the register RG, so that the signal A0 is acquired in the register. Since the signal EB becomes high at the time when the signal E becomes high, the multiplexer MUX receiving the signal makes switching control a path so that the signals M1 through M4 are selected and the signals X1 through X4 are outputted. The register RG with inputs of the signals M1 through M4 acquires data at a clock edge of the signal K, and outputs the signals B1 through B4. In a next cycle, when a burst mode is established, the signal E becomes low, and the signal EK is fixed at low and does not alter, so that in the register of the circuit BCC1, the data A0 at the external address acquisition of the previous cycle is held. In the case where the signal E is low, in accordance with a high signal of the signal FB or RB, a path in which the feedback data B1R through B4R are selected and the signals M1 through M4 are outputted, is formed in the multiplexer MUX. For example, in the multiplexer MUX for generating the signal M1, in the case where the signal FB is high, the multiplexer MUX is switched so that the forward direction shift occurs such that the signal B4R is shifted to the signal M1, and the signal B1R is shifted to the signal M2. In the case where the signal RB is high, the multiplexer MUX is switched so that the reverse direction shift occurs such that the signal B2R is shifted to the signal M1, and the signal B3R is shifted to the signal M2. That is, the selection of the forward circulation or reverse circulation of the burst sequence is determined by whether the signal A0 as the least significant base address is low or high. This is apparent from the decode sequence of the burst counter in Table 2, and this embodiment uses this regularity to construct the burst control circuit.

Figure 5:
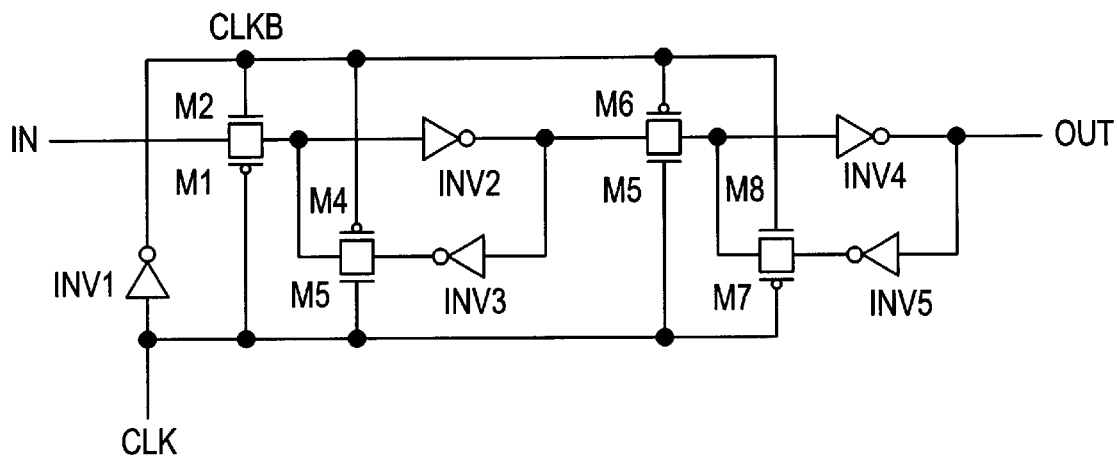
FIG. 5 is a view of a typical register circuit R6.

An example of the register RG and the multiplexer MUX as circuit blocks constituting this embodiment will be described in detail. A register circuit is shown in FIG. 5. An input signal IN is connected to source terminals of a pMOS (p-type MOS transistor) M1 and an nMOS (n-type MOS transistor) M2, a control signal CLK and its reverse phase signal CLKB are inputted to the respective gates, drain terminals of the MOSs M1 and M2 are connected and are inputted into a next stage inverter INV2. The output of the inverter INV2 is inputted into an inverter INV3, and the output of the inverter INV3 is connected to the input of the inverter INV2 through a second transfer circuit formed of an nMOS M3 and a pMOS M4. The signals CLK and CLKB are inputted into the respective gates at this time. A latch circuit is formed of the portions from the signal IN to the output of the inverter INV2, and a similar circuit is constructed of MOSs M5 through M8 and inverters INV4 and INV5. The output of the inverter INV2 is made the input of a next stage, and the output of the inverter INV4 is made the output OUT of the register. The former half latch circuit is referred to as a master latch, and a latter half latch circuit is referred to as a slave latch, which is the same as the master latch in the logic except that the logic of the signals CLK and CLKB inputted into the transfer circuits M5 through M8 of the slave latch is reverse. In this circuit, the input data is latched and acquired by the master latch at a changing edge where the signal CLK is changed from low to high (signal CLKB is changed from high to low), and the slave latch passes the data through so that the data is outputted. The slave latch first changes the data of the previous cycle latched until at this time. In the case where the edge of the signal CLK becomes low from high, since the master side data is merely latched by the slave side, the output of the register does not change.

Figure 6:
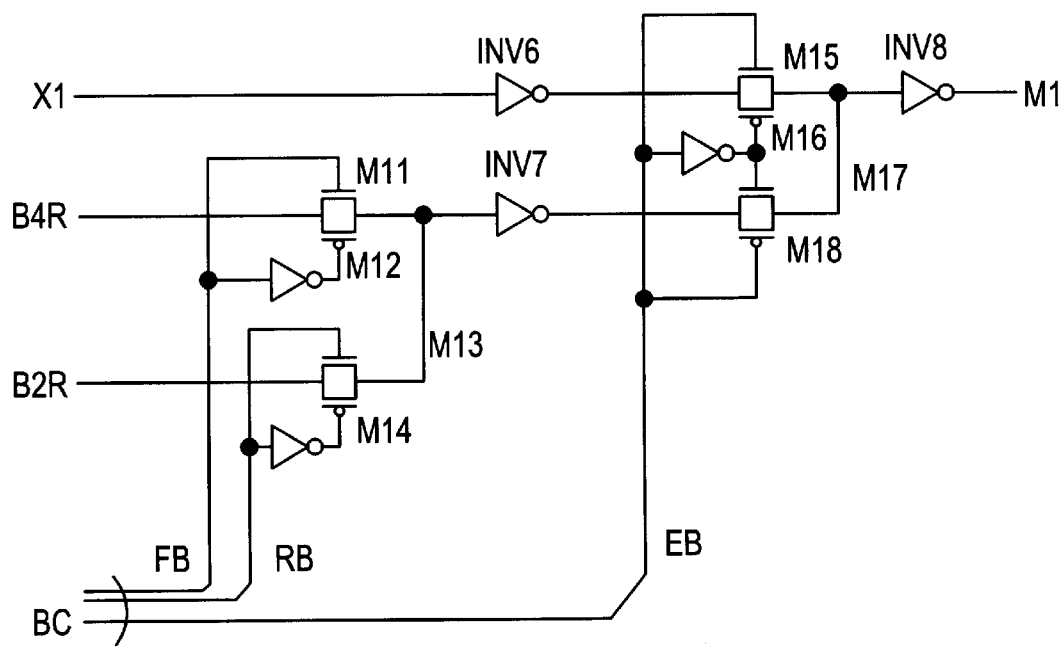
FIG. 6 is a view of a typical multiplexer circuit MUX.

FIG. 6 shows a multiplexer circuit. An nMOS M15 and a pMOS M16 are connected in parallel to the output of an inverter INV6 with input of the signal X1 so that a transfer circuit is formed. The signal EB and its reverse phase signal are inputted into the respective gates, the output is inputted into an inverter INV8, and the output of the inverter INV8 is the output M1 of the multiplexer MUX. Similarly to the transfer circuit, a pMOS M18 and an nMOS M17 are connected in parallel with each other, the signal EB and its reverse signal are inputted into the respective gate, and the MOSs M18 and M17 are disposed between the output of the inverter INV7 and the input of the inverter INV8. For the input B4R, a transfer of an nMOS M11 and a pMOS M12 is provided, the signal FB and its reverse signal are inputted as the gate input, and the output is inputted and connected to the inverter INV 7. Similarly, for the input B2R, a transfer of an nMOS M13 and a pMOS M14 is provided, the signal RB and its reverse signal are inputted as the gate input, and the output is inputted and connected to the inverter INV7. In this circuit, when the signal EB is high, the MOSs M15 and M16 are turned on, so that the signal X1 is outputted to the signal M1 through the inverters INV6 and INV8. When the signal EB is low, since the MOSs M17 and M18 are turned on, the signal is outputted to the signal M1 through the inverters INV7 and INV8. However, the front stage path is different according to the signals FB and RB. When the signal FB is high, since the MOSs M11 and M12 are turned on, the signal B4R is outputted to the signal M1. When the signal RB is high, since the MOSs M13 and M14 are turned on, the signal B2R is outputted to the signal M1.

In this burst counter circuit and the second conventional circuit, the delay times from the input K to the outputs B1 through B4 will be compared with each other in view of the number of the logic gate stages. At this time, it is assumed that the register circuit and the multiplexer circuit are the same as the circuits shown in FIGS. 5 and 6, and the transfer circuit is calculated as one stage of logic gate. In the conventional example, at the external address input, the circuit EKB has two stages, the register RG has two stages, and the multiplexer MUX has three stages, so that the total is seven stages. Although the inverters of two stages (INV6, INV8 ) in the multiplexer MUX can be omitted logically, since a load is applied to the outputs E1 through E4 of the register RG for signal transfer to the circuit BCC2, it is too heavy to drive the total output load of the outputs B1 through B4 by the output of the register RG while the multiplexer MUX is made of only the transfer circuit. Accordingly, the inverters must be added as buffers. At the burst operation, the register RG1 has two stage, and the multiplexer MUX has four stages, so that the total is six stages, which is smaller. However, it is apparent that the path at the external address input becomes a speed limit. On the other hand, in the present embodiment, both at the external address input and the burst operation, the total is only two stages of the register RG. This shortens the delay time to about a half. At the same time, the number of register circuits are reduced from eight to five, so that the invention is also effective in the reduction of layout area. Also, since the multiplexer MUX is placed at the front of the register RG, the path from the input ADD to the input of the register RG becomes long, so that the delay time may be increased. However, there is no problem if the delay time is within the setup time for the signal K inputted into the register RG. Since also the address signal inputted into the circuit BCC1 can be realized by only one signal A0, the influence due to the increase of load can be made extremely small.

Figure 7:
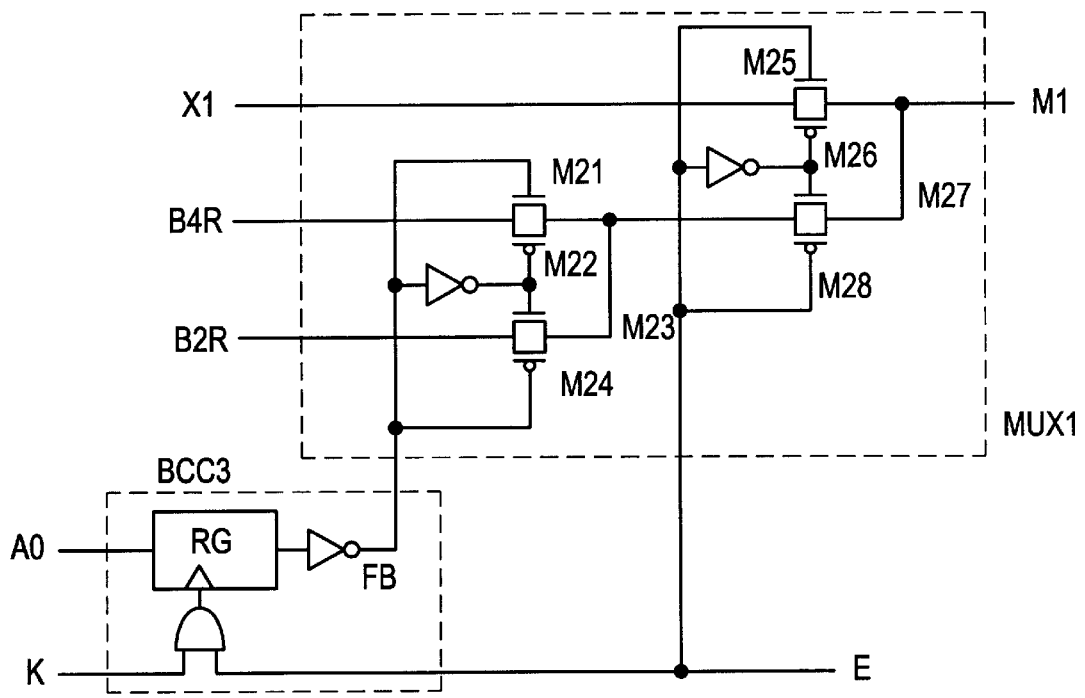
FIG. 7 is a partial view of a burst control circuit of a second embodiment of the present invention.

A second embodiment will next be described with reference to FIG. 7. In this embodiment, as compared with the first embodiment, the burst control circuit and the multiplexer circuit are simplified. In FIG. 7, the portions equivalent to those of the first embodiment in view of circuit construction, will be omitted.

A burst control circuit BCC3 includes only the portion for generating the signal FB in the first embodiment. As a control signal to a multiplexer circuit MUX1, the signal FB of the output of the circuit BCC3 and an external address acquisition signal E are directly inputted. An nMOS M21 and a pMOS M22 with gates to which the signal FB and its reverse phase signal are inputted, are made a transfer circuit, and the feedback signal B4R from an adjacent register at a forward circulation is inputted. Similarly, a pMOS M24 and an NMOS M23 with gates to which the signal FB and its reverse phase signal are inputted, are made a transfer circuit, and the feedback signal B2R from an adjacent register at a reverse circulation is inputted. The outputs from these two pairs of transfer circuits are connected to the output of a first stage. Similarly two pairs of transfer circuits are formed in which the output of the first stage and the output X1 from the decoder are input, the signal E is inputted as the gate signal, and the respective outputs are connected to make the output M1.

The operation of the circuit will be described. Since the signal E is high at the external address acquisition, the MOSs M25 and M26 turn on, and the MOSs M27 and M28 turn off, so that the input X1 is transferred to the output through the transfer circuit. Since the signal E is low at the burst mode, the path at the signal X1 side turns off, and the path at the signal B4R or B2R turns on. Since similar switching of the transfer circuit is also performed by the signal FB, when the signal FB is high, the signal B4R is transferred as the output through the transfer circuits of two stages. When the signal FB is low, the signal B2R is outputted. An inverter is not inserted as a buffer circuit in the multiplexer. Since the output of the multiplexer MUX1 is inputted into only the register, the load is reduced. In the case where the outputs B1 through B4 are driven as in the conventional example, a large next stage circuit or long wiring is often connected, and the waveform is largely deformed if only a circuit of transfer system is used, so that the delay time is long. Further, since the load at the terminal M1 of the output of the multiplexer MUX1 of the present embodiment is reduced, the size of switch transistors constituting the transfer circuit can be made small. This enables the signal E to be directly inputted into the multiplexer MUX1, which enables the transfer circuit for switching the signals B4R/B2R to be selected and operated by only one signal FB.

Figure 8:
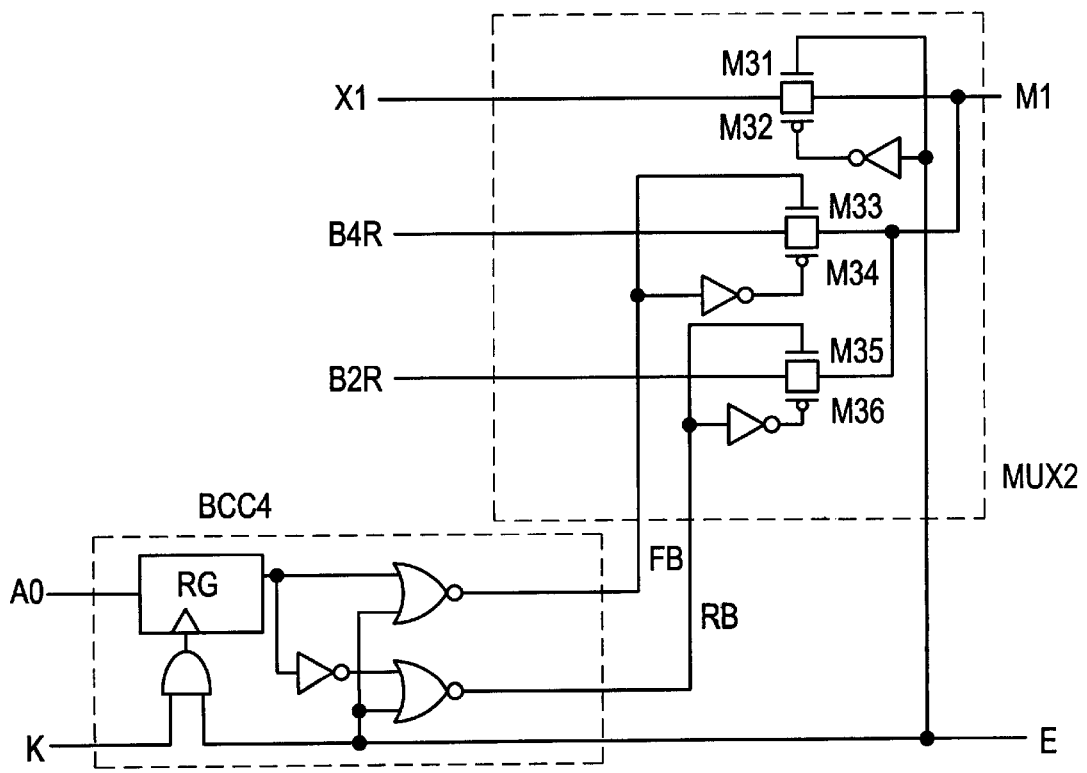
FIG. 8 is a partial view of a burst control circuit of a third embodiment of the present invention.

A third embodiment will next be described with reference to FIG. 8. In this embodiment, as compared with the first embodiment, the transfer circuit of the multiplexer circuit is not connected in series in two stages, but the transfer circuit is enabled to be formed of only one stage. There are provided two NOR logic circuits with inputs of the output of a register to acquire data A0 of a burst control circuit BCC4 and its reverse signal. The respective outputs of the circuits will be referred to as signals FB and RB. The input signal of the other of the respective NOR logic circuits is an external address acquisition control signal E, and at the same time, the signal E, as well as the signals FB and RB, is inputted as the control signal into the multiplexer MUX2. An nMOS M31 and a pMOS M32 with gate inputs of the signal E and its reverse phase signal is formed into a transfer circuit, and is connected between the input X1 and the output M1. Similarly, the respective transfer circuits with gate control of the signals FB and RB are connected to each other with inputs of the signals B4R and B2R, and all the outputs are commonly connected to the output M1.

The operation will now be described. When the external address is acquired, the signal E becomes high, and data X1 is transferred to the output M1. At this time, since both the signals FB and RB are low, conflict of data can not occur. At the burst operation, the signal E becomes low, and the path from the signal X1 is interrupted. Here, based on the base address data of the signal A0 stored in the register of the circuit BCC4, either one of the signals FB and RB becomes high, and data of either one of the signals B4R and B2R is transferred to the output M1. The path in the multiplexer from the signal B4R or B2R is the transfer switch circuit of one stage, which has an effect to improve the speed of the path. If the reverse signals of the respective signals E, FB and RB are supplied to the multiplexer MUX2, the inverter circuit in the multiplexer MUX2 becomes unnecessary, so that it becomes possible to make construction by only six transistor elements.

Next, an example in which a burst address is composed of three bits, will be described. On the basis of the external address input, the address of lower Add0, Add1 and Add2 is internally generated at the burst. Table 3 shows the sequence in the interleave mode.

TABLE 3

| External input address | Add0 | Add1 | Add2 | Add3 | — |
|---|---|---|---|---|---|
| First burst address | Add0 | Add1 | Add2 | Add3 | — |
| Second burst address | Add0 | $\overline{\text{Add1}}$ | Add2 | Add3 | — |
| Third burst address | Add0 | $\overline{\text{Add1}}$ | Add2 | Add3 | — |
| Fourth burst address | Add0 | Add1 | $\overline{\text{Add2}}$ | Add3 | — |
| Fifth burst address | Add0 | Add1 | $\overline{\text{Add2}}$ | Add3 | — |
| Sixth burst address | Add0 | $\overline{\text{Add1}}$ | $\overline{\text{Add2}}$ | Add3 | — |
| Seventh burst address | Add0 | $\overline{\text{Add1}}$ | $\overline{\text{Add2}}$ | Add3 | — |

In accordance with the object of the present invention, when a burst counter circuit is initiated after decoding of the address Add0 through Add2, the decode sequence at burst is as shown in Table 4. The select signals B1 through B8 of a burst counter circuit are selected in such a complicated sequence. In addition to the forward circulation and reverse circulation at two bit burst, a switching operation between the group of the signals B1 through B4 and the group of the signals B5 through B8 is added, so that it is understood that factors to determine this sequence include the address input Add1 in addition to the address input Add0.

TABLE 4

| EXT input add 0, 1, 2 | 000 | 100 | 010 | 110 | 001 | 101 | 011 | 111 |
|---|---|---|---|---|---|---|---|---|
| EXT input Select signal | B1 | B2 | B3 | B4 | B5 | B6 | B7 | B8 |
| 1ST burst Select signal | B2 | B1 | B4 | B3 | B6 | B5 | B8 | B7 |
| 2ND burst Select signal | B3 | B4 | B1 | B2 | B7 | B8 | B5 | B6 |
| 3RD burst Select signal | B4 | B3 | B2 | B1 | B8 | B7 | B6 | B5 |
| 4TH burst Select signal | B5 | B6 | B7 | B8 | B1 | B2 | B3 | B4 |
| 5TH burst Select signal | B6 | B5 | B8 | B7 | B2 | B1 | B4 | B3 |
| 6TH burst Select signal | B7 | B8 | B5 | B6 | B3 | B4 | B1 | B2 |
| 7TH burst Select signal | B8 | B7 | B6 | B5 | B4 | B3 | B2 | B1 |

Figure 9:
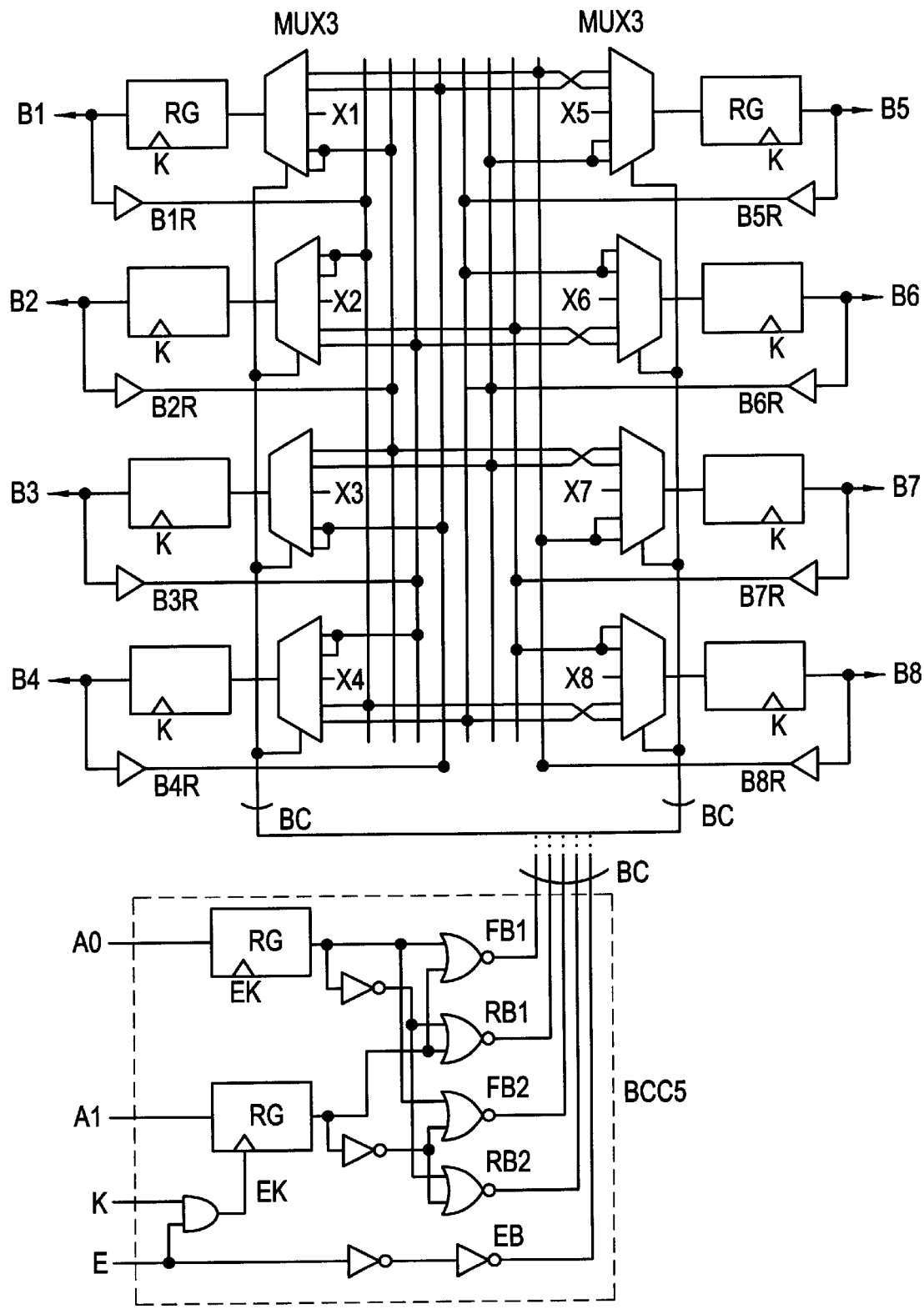
FIG. 9 is a view of a burst counter circuit of a fourth embodiment of the present invention.

A burst counter circuit constructed on the basis of this table is shown in FIG. 9 as a fourth embodiment. Outputs X1 through X8 of decoder circuits with inputs of positive/negative signals A0 through A2 of the address Add0 through Add2 or the inverted A0 through A2 are inputted into multiplexers MUX3, the respective outputs are inputted into registers RG, and their outputs B1 through B8 are transferred to an internal memory circuit. Here, an internal clock signal K synchronous with an external clock, controls the registers RG. Five data inputs to the multiplexer MUX3 are composed of, for example, in the case of the path of the signal B1, in addition to the signal X1 from the decoder, feedback paths of the signals B8R, B4R, B2R, and B2R from the outputs B8, B4, B2, and B2 through the buffers. The switching signal for the five kinds of data is the signal BC, which is composed of five signals FB1, FB2, RB1, RB2, and EB. It can be constructed in the same manner as the multiplexer circuit explained in the first embodiment in which three kinds of data are switched by three control signals. A control circuit for generating the signal BC is a circuit BCC5, which includes registers for acquiring address signals A0 and A1 before being decoded and an AND logic buffer circuit with inputs of signals K and E for generating a clock signal EK to control the registers. Four NOR decode logic circuits with inputs of the output of these registers and their inverted signals, are provided, and the outputs are referred to as signals FB1, FB2, RB1, and RB2. E denotes an external address acquisition signal which is outputted from the circuit BCC5 as the same phase signal EB through the buffer.

The operation will next be described. One of decode signal outputs X1 through X8 corresponding to three addresses, becomes high and is selected, and the others are low and is in a non-selected state and is inputted into the multiplexer MUX3. For example, when all address inputs Add0 through Add2 are low and the signal X1 is selected, and when the signal E becomes high at the acquisition of the external address, the signal EK is generated synchronously with a rising edge of the signal K in the circuit BCC5, and is inputted into the register RG and the signals A0 and A1 are acquired in the register. Since the signal EB becomes high at the time when the signal E becomes high, the multiplexer MUX3 receiving the signal makes switching control a path so that the signals X1 through X8 are selected and are outputted. The register RG with input of the output of the multiplexer MUX3 acquires data at the clock edge of the signal K, and outputs to the signals B1 through B8. When the burst mode is made at a next cycle, the signal E becomes low, the signal EK is fixed at low, and the data A0 and A1 of the previous cycle (at the acquisition of external address) are held in the register of the circuit BCC5. In the case that the signal E is low, in accordance with the signal selected from the signals FB1, FB2, RB1, and RB2 are to become high, the feedback data of the signals B1R through B8R is selected to form a path in the MUX3 to output to the register RG. For example, in the multiplexer MUX3 of a path to generate the signal B1, in the case where the signal FB1 is high, the multiplexer MUX3 is switched so that the signal B8R is shifted to the signal B1 and the signal B1R is shifted to the signal B2. In the case where the signal FB2 is high, the signal B4R is transferred to the signal B1 and the signal B1R is transferred to the signal B2. In the case where the signal FB2 is high, the signal B2R is transferred to the signal B1, and the signal B7R is transferred to the signal B2. In the case where the signal RB2 is high, the signal B2R is transferred to the signal B1, and the signal B3R is transferred to the signal B2. In this way, it is understood that the burst counter circuit of the present invention can be easily applied in the same manner even if the number of burst address is increased.

Referring to table 3, the lower 3 bits, that is, Address Add0, Add1, Add2 are used at seventh burst address cycle to carry out the burst movement. Referring to table 1, the lower 1 bit is used at third burst address cycle. That is, generally the lower n bits (n:integer) are used at $2^n$ burst address cycle to carry out the burst movement.

Figure 10:
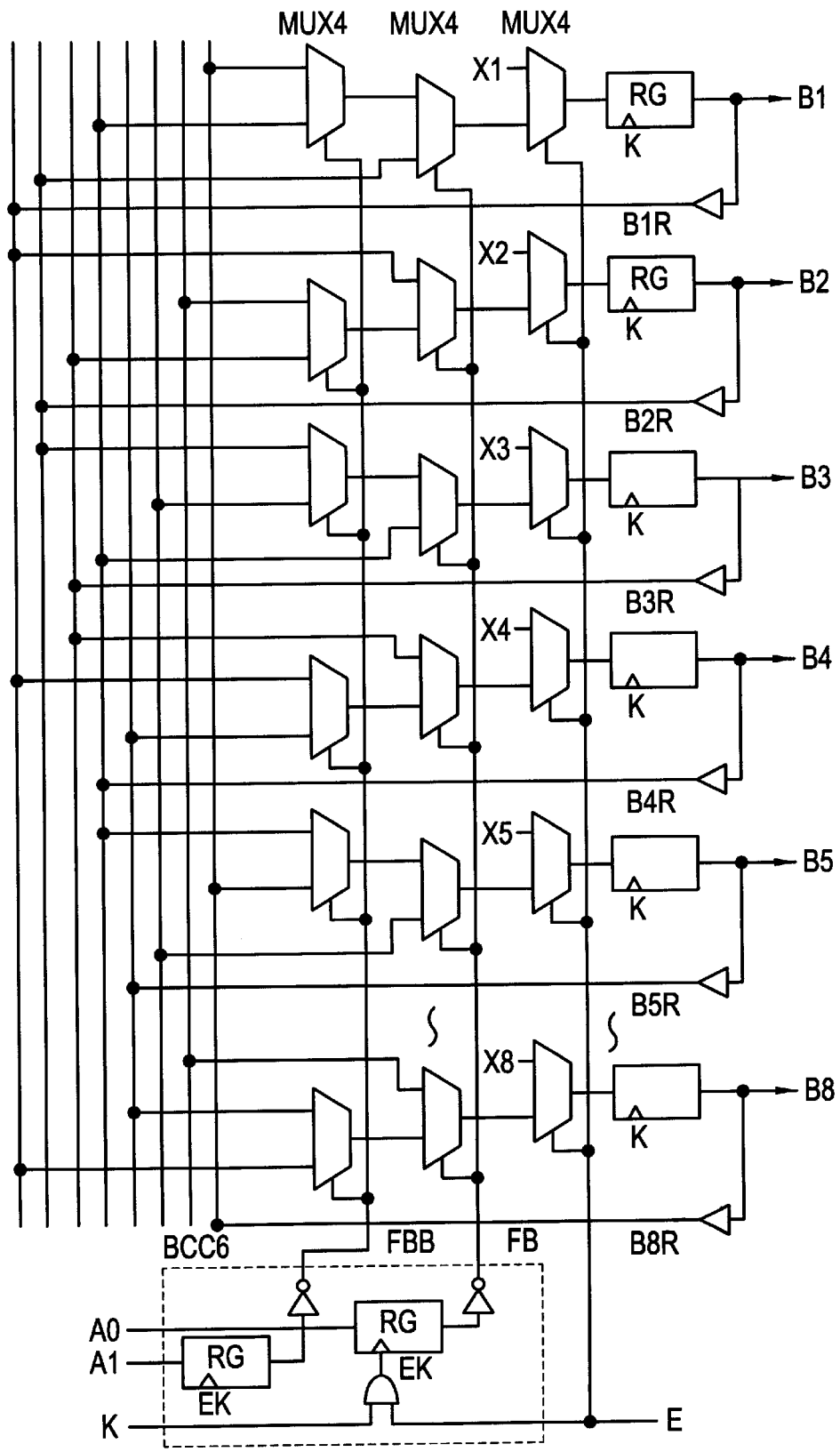
FIG. 10 is a view of a burst counter circuit of a fifth embodiment of the present invention.

A fifth embodiment will next be described with reference to FIG. 10. In this embodiment, as compared with the fourth embodiment, the burst control circuit and the multiplexer circuit are simplified. A burst control circuit BCC6 is comprised of only an A0 data register, a circuit for its inverted signal FB, an A1 data register, and a circuit for generating its inverted signal FBB. Although the register RG to output signals B1 through B8 and the portions of the feedback signals B1R through B8R are the same as those of the fourth embodiment, the multiplexer before the register RG is formed of three stage series connection of the circuits MUX4 to select two signals. When considering the B1 output path as an example, the switching signal for the first stage multiplexer MUX4 with inputs of signals B4R and B8R is the signal FBB, the switching signal for the second stage multiplexer MUX4 with inputs of the output of the first state MUX4 and the signal B2R is the signal FB, and the switching signal for the third stage multiplexer MUX4 with inputs of the output of the second stage multiplexer MUX4 and the signal X1 is the signal E. When the external address is acquired and the signal E is high, the signals X1 through X8 are acquired in the register RG, when the signal E is low at the burst, the signal FB is determined by the A0 base address, and the function of establishing forward circulation when the signal is high and the reverse circulation when the signal is low, is the same as in the two bit burst. However, when the signal FBB is changed by the base address A1 and the signal is low instead of high, the sequence is changed so that the pair of the signals B1 and B2 is switched to the pair of the signals B3 and B4, and the pair of the signals B5 and B6 is switched to the pair of the signals B7 and B8. By adding this switching, the burst sequence of the multiplexer coincides with Table 4. This system is advantageous in that the number of control signal lines is small.

Figure 11:
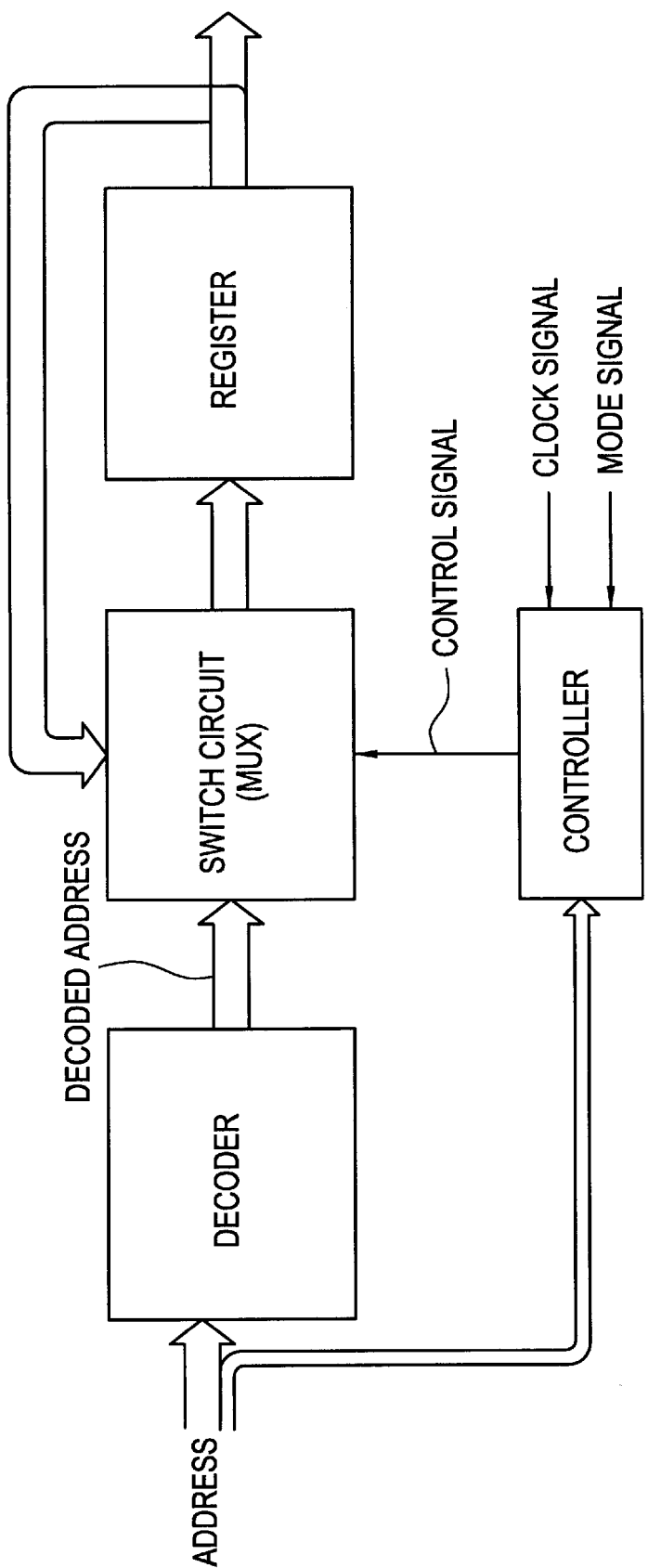
FIG. 11 is a block diagram showing a burst counter circuit of the present invention.

FIG. 11 is a block diagram showing a burst counter circuit of the present invention. As illustrated, the semiconductor circuit of the present invention includes a decoder, a control circuit, a switch circuit, and a registor. The decoder responds to a plurality of address signals to produce a plurality of decoded address signals. The control circuit generates a control signal in response to at least a portion of the address signal. The switch circuit receives the decoded address signals and shifting the decoded address signals in response to the control signal to produce an output of a shifted decoded address signal. The register receives the output of the switch circuit.

As described above, according to the present invention, in a memory circuit for high speed signal output in which an input register circuit is placed after a decode logic circuit for a burst address, this register is made to have also a function of a burst counter register. A clock input is directly inputted into this register, and the output of the register is directly transferred to an internal memory, and the output is simultaneously feedback to the other registers through the multiplexer circuits disposed before the respective registers. The burst sequence is realized by the switching control of the multiplexers, and the control signal is generated by using a part of the burst address signal before being decoded.

According to this, the number of stages of data output path from the clock to the internal memory circuit can be remarkably reduced from seven stages to two stages. This is accomplished since the multiplexer circuit is removed from the critical path, and the delay time can be greatly shortened to an about a half. Since the multiplexer is placed at the front stage of the register, although this path must operate within the setup time of the register, this is not a problem. This is an effect caused from the fact that the load of the multiplexer output is only a register so that the load is small, and the number of address signals inputted into the multiplexer control circuit is reduced from four to one so that the load is very small.

Also in the number of the circuit elements, since it is not necessary to separate registers into an input one and a burst one, the number of the registers can be reduced from eight to five.

It is apparent that the present invention is not limited to the above embodiments but may be modified and changes without departing from the scope ad spirit of the invention.

What is claimed is:

1. A semiconductor circuit comprising:
   a decoder responsive to a plurality of address signals to produce a plurality of decoded address signals;
   a control circuit for generating a control signal in response to at least a portion of said address signals;
   a switch circuit receiving said decoded address signals and shifting said decoded address signals in response to said control signal to produce shifted signals; and
   a register receiving said shifted signals.

2. The circuit as claimed in claim 1, wherein said register receives said decoded address signals outputted from said switch circuit at a first mode and receives said shifted decoded address signals outputted from said switch circuit at a second mode.

3. The circuit as claimed in claim 1, wherein said control circuit comprises a latch circuit for latching said portion of said address signals in response to a clock signal and a mode signal to produce a latched address signal, and said control signal is produced from said latched address signal and said mode signal.

4. The circuit as claimed in claim 1, wherein said control signal is generated based on lower n bits (n:integer) of said address signals at $(2^n-1)$ burst address cycle.

5. The circuit as claimed in claim 1, thereby improving the delay time for generating a sequence of burst addresses.

6. The circuit as claimed in claim 1, wherein said switch circuit is directly connected to said decoder.

7. A semiconductor circuit comprising:
   a decoder responsive to a plurality of address signals to produce a plurality of decoded address signals;
   a control circuit for generating a control signal in response to at least a portion of said address signals, said control circuit having at least one latch circuit;
   a switch circuit receiving said decoded address signals and shifting said decoded address signals in response to said control signal to produce shifted signals; and
   a register receiving said shifted signals.

8. The circuit as claimed in claim 7, thereby improving the delay time for generating a sequence of burst addresses.

9. A semiconductor circuit comprising:
   a decoder responsive to a plurality of address signals to produce a plurality of decoded address signals;
   a plurality of switch circuits receiving said decoded signals, respectively, each of said switch circuits outputting an output signal;
   a plurality of registers each receiving the output signals from a corresponding one of said switch circuits and outputting a latched output signal; and
   a control circuit generating a control signal in response to a portion of said address signals;
   said switch circuits and said registers being coupled so that each of said switch circuits outputs one of the corresponding decoded address signals and the corresponding latched output signal as the corresponding output signal according to said control signal.

10. The circuit as claimed in claim 9, wherein said control circuit comprises a latch circuit for latching said portion of said address signals in response to a clock signal and a mode signal to produce a latched address signal, and said control signal is produced from said latched address signal and said mode signal.

11. The circuit as claimed in claim 10, wherein each of said switch circuit comprises a first gate transferring one of the corresponding latched output signals to a node in response to said latched address signal and a second gate transferring one of the corresponding decoded address signal and a signal transferred to said node as said output signal in response to said mode signal.

12. The circuit as claimed in claim 10, wherein said control circuit further comprises a logic gate receiving said latched address signal and outputting said latched address signal only when said mode signal is a first logic level, said switch circuit comprises a first gate transferring one of the corresponding latched output signals as said output signal when said mode signal is said first logic and a second gate transferring one of the corresponding decoded address signals as said output signal when said mode signal is a second logic level.

13. The circuit as claimed in claim 10, wherein said control circuit further comprises a first gate receiving said latched address signal and said mode signal and outputting a first control signal and a second gate receiving an inverse latched address signal and said mode signal and outputting a second control signal, each of the switch circuits comprises a first gate transferring one of the corresponding latch output signals as said output signal in response to said first and second control signal when said mode signal is a first logic level and a second gate transferring the corresponding decoded address signal as said output signal when said mode signal is a second logic level.

14. The circuit as claimed in claim 10, wherein said latch circuit outputs said latched output signal in response to said clock signal.

15. A semiconductor circuit comprising:
a decoder responsive to a plurality of address signals to produce a plurality of decoded address signals;
a switch circuit receiving said decoded address signals and outputting at least one output signal;
a register latching said output signal in response to a clock signal to output a latched output signal, said latched output signal being applied to said switch circuit; and
a control circuit having a latch circuit latching a portion of said address signals in response to said clock signal to output a latched address signal when a mode signal is a first logic level, and maintaining to output said latched address signal when said mode signal is a second logic level without said clock signal, said control circuit producing a control signal according to said latched address signal and said mode signal;
said switch circuit outputting one of said decoded signal and said latched output signal as said signal according to said control signal.

16. A semiconductor circuit comprising:
a decoder circuit receiving a first address signal and a second address signal and decoding said first and second address signal to produce first though fourth decoded address signals;
a first switch circuit receiving said first decoded address signal and outputting a first output signal;
a second switch circuit receiving said second decoded address signal and outputting a second output signal;
a third switch circuit receiving said third decoded address signal and outputting a third output signal;
a fourth switch circuit receiving said fourth decoded address signal and outputting a fourth output signal;
a first register latching said first output signal in response to a clock signal and outputting a first latched signal;
a second register latching said second output signal in response to a clock signal and outputting a second latched signal;
a third register latching said third output signal in response to a clock signal and outputting a third latched signal;
a fourth register latching said fourth output signal in response to a clock signal and outputting a fourth latched signal;
a control circuit having a latch circuit latching said first address signal according to said clock signal and a mode signal and outputting a latched address signal;
said first switch circuit receiving said second and fourth latched signals and outputting one of said first decoded address signal, said second and fourth latched signals as said first output signal in response to said latched address signal and said mode signal.

17. The circuit as claimed in claim 16, wherein,
said second switch circuit receives said first and third latched signals and outputs one of said second decoded address signal, said first and third latched signals as said second output signal in response to said latched address signal and said mode signal, said third switch circuit receives said second and fourth latched signals and outputs one of said third decoded address signal, said second and fourth latched signals as said third output signal in response to said latched address signal and said mode signal, and said fourth switch circuit receives said first and third latched signals and outputs one of said fourth decoded address signal, said first and third latched signals as said fourth output signal in response to said latched address signal and said mode signal.

18. The circuit as claimed in claim 16, wherein said first switch circuit comprises a first gate transferring one of said second and fourth latched output signals to a node in response to said latched address signal and a second gate transferring one of said first decoded address signal and a signal transferred to said node as said output signal in response to said mode signal.

19. The circuit as claimed in claim 16, wherein said control circuit further comprises a logic gate receiving said latched address signal and outputting said latched address signal only when said mode signal is a first logic level, said first switch circuit comprises a first gate transferring one of said second and fourth latched output signals as said output signal when said mode signal is said first logic level and a second gate transferring said first decoded address signal as said output signal when said mode signal is a second logic level.

20. The circuit as claimed in claim 16, wherein said control circuit further comprises a first gate receiving said latched address signal and said mode signal and outputing a first control signal and a second gate receiving an inverse latched address signal and said mode signal and outputing a second control signal, said switch circuit comprises a first gate transferring one of said latched output signals as said output signal in response to said first and second control signal when said mode signal is a first logic level and a second gate transferring said decoded address signal as said output signal when said mode signal is a second logic level.

21. A semiconductor circuit comprising:
a first buffer having an input terminal receiving a first address and an output terminal;
a first inverter having an input terminal receiving said first address and an output terminal;
a second buffer having an input terminal receiving a second address and an output terminal;
a second inverter having an input terminal receiving said second address and an output terminal;
a first gate having an input terminal, coupled to said output terminals of said first and second buffers, and having an output terminal;
a second gate having an input terminal, coupled to said output terminals of said first inverter and said second buffer, and having an output terminal;
a third gate having an input terminal, coupled to said output terminals of said first buffer and said second inverter, and having an output terminal;
a fourth gate having an input terminal, coupled to said output terminals of said first and second inverters, and having an output terminal;
a first multiplexer having an input terminal coupled to said output terminal of said first gate and having an output terminal;
a second multiplexer having an input terminal coupled to said output terminal of said second gate having an output terminal;

a third multiplexer having an input terminal coupled to said output terminal of said third gate having an output terminal;

a fourth multiplexer having an input terminal coupled to said output terminal of said fourth gate having an output terminal;

a first register having an input terminal coupled to said output terminal of said fist multiplexer and having an output terminal;

a second register having an input terminal coupled to said output terminal of said second multiplexer and having an output terminal;

a third register having an input terminal coupled to said output terminal of said third multiplexer and having an output terminal;

a fourth register having an input terminal coupled to said output terminal of said fourth multiplexer and having an output terminal; and a control circuit comprising;
 - a fifth register having an input terminal coupled to said output terminal of said first buffer and having output terminal;
 - a fifth gate having an input terminal receiving a clock signal and a mode signal and having an output terminal coupled to said fifth register;
 - a third inverter having an input terminal coupled to said output terminal of said fifth register and having an output terminal coupled to said first through fourth multiplexers;
 - a third buffer having an input terminal coupled to said output terminal of said fifth register and having an output terminal coupled to said first through fourth multiplexers; and
 - a fourth buffer having an input terminal receiving said mode signal and having an output terminal coupled to said first through fourth multiplexers; wherein said input terminal of said first multiplexer are coupled to said output terminals of said fourth and second registers;

said input terminal of said second multiplexer are coupled to said output terminals of said first and third registers;

said input terminal of said third multiplexer are coupled to said output terminals of said second and fourth registers;

said input terminal of said fourth multiplexer are coupled to said output terminals of said third and first registers.

22. A semiconductor circuit comprising:

first through eighth registers each having an input terminal and an output terminal;

a first multiplexer having an input terminal coupled to said output terminals of said eight, fourth and second registers and receiving a first decoded address signal and having an output terminal coupled to said input terminal of said first register;

a second multiplexer having an input terminal coupled to said output terminals of said first, seventh and third registers and receiving a second decoded address signal and having an output terminal coupled to said input terminal of said second register;

a third multiplexer having an input terminal coupled to said output terminals of said second, sixth and fourth registers and receiving a third decoded address signal and having an output terminal coupled to said input terminal of said third register;

a fourth multiplexer having an input terminal coupled to said output terminals of said third, first and fifth registers and receiving a fourth decoded address signal and having an output terminal coupled to said input terminal of said fourth register;

a fifth multiplexer having an input terminal coupled to said output terminals of said eighth, fourth and sixth registers and receiving a fifth decoded address signal and having an output terminal coupled to said input terminal of said fifth register;

a sixth multiplexer having an input terminal coupled to said output terminals of said fifth, seventh and third registers and receiving a sixth decoded address signal and having an output terminal coupled to said input terminal of said sixth register;

a seventh multiplexer having an input terminal coupled to said output terminals of said second, sixth and eighth registers and receiving a seventh decoded address signal and having an output terminal coupled to said input terminal of said seventh register;

a eighth multiplexer having an input terminal coupled to said output terminals of said seventh, first and fifth register and receiving a eighth decoded address signal and having an output terminal coupled to said input terminal of said eighth register; and a control circuit comprising;
 - a ninth register having an input terminal receiving a first address signal and having an output terminal;
 - a tenth register having an input terminal receiving a second address signal and having an output terminal;
 - a first gate having an input terminal receiving a clock signal and a mode signal and having an output terminal coupled to said ninth and tenth registers;
 - a first inverter having an input terminal coupled to said output terminal of said ninth register and having an output terminal;
 - a second inverter having an input terminal coupled to said output terminal of said tenth register and having an output terminal;
 - a second gate having an input terminal coupled to said output terminals of said ninth and tenth registers and having an output terminal;
 - a third gate having an input terminal coupled to said output terminals of said first inverter and tenth register and having an output terminal;
 - a fourth gate having an input terminal coupled to said output terminals of said ninth register and second inverter and having an output terminal; and
 - a fifth gate having an input terminal coupled to said output terminals of said first and second inverters and having an output terminal; wherein each of said first through eighth multiplexer are coupled to said output terminals of said second through fifth registers and receive said mode signal.

23. A semiconductor circuit comprising:

first through eighth registers each having an input terminal and an output terminal;

a control circuit comprising;
 - a ninth register having an input terminal receiving a first address signal and a control signal and having an output terminal;
 - a tenth register having an input terminal receiving a second address signal and said control signal and an output terminal; and
 - a gate receiving a clock signal and a mode signal and outputing said control signal;

a first multiplexer having a first input terminal coupled to said output terminals of said eighth and fourth registers and a second input terminal coupled to said output terminal of said ninth register, and having an output terminal;

a second multiplexer having a first input terminal coupled to said output terminal of said first multiplexer and said output terminal of said second register and a second input terminal coupled to said output terminal of said tenth register, and having an output terminal; and a third multiplexer having a first input terminal coupled to said output terminal of said second multiplexer and receiving a first decoded address signal and a second terminal coupled to receive said mode signal.

24. A semiconductor circuit comprising:

a resister responding to a control signal to latch a address signal, said register outputing a latched address signal;

a control gate producing said control signal in response to a clock signal and a mode signal;

a first inverter receiving said latched address signal to produce an inverse latched address signal;

a first transistor of a first type having a current path between a first node receiving a first signal and a second node and having a control gate receiving said latched address signal;

a second transistor of a second type having a current path between said first node and said second node and having a control gate receiving said inverse latched address signal;

a third transistor of said first type having a current path between a third node receiving a second signal and said second node and having a control gate receiving said inverse latched address signal;

a fourth transistor of said second type having a current path between said third node and said second node and having a control gate receiving said latched address signal;

a second inverter receiving said mode signal to produce an inverse mode signal;

a fifth transistor of said first type having a current path between a fourth node receiving a decoded address signal and a fifth node and having a control gate receiving said mode signal;

a sixth transistor of said second type having a current path between said fourth node and said fifth node and having a control gate receiving said inverse mode signal;

a seventh transistor of said first type having a current path between said second node and said fifth node and having a control gate receiving said inverse mode signal; and a eighth transistor of said second type having a current path between said second node and said fifth node and having a control gate receiving said mode signal.

25. A semiconductor circuit comprising:

a resister responding to a first control signal to latch a address signal, said register outputing a latched address signal;

an inverter receiving said latched address signal to produce an inverse latched address signal;

a first control gate producing said first control signal in response to a clock signal and a mode signal;

a second control gate producing a second control signal in response to said latched address signal and said mode signal;

a third control gate producing a third control signal in response to said inverse latched address signal and said mode signal;

a first transistor of a first type having a current path between a first node receiving a first signal and a second node and having a control gate receiving said second control signal;

a second transistor of a second type having a current path between said first node and said second node and having a control gate receiving an inverse second control signal;

a third transistor of said first type having a current path between a third node receiving a second signal and said second node and having a control gate receiving said third control signal;

a fourth transistor of said second type having a current path between said third node and said second node and having a control gate receiving an inverse third control signal;

a fifth transistor of said first type having a current path between a fourth node receiving a decoded address signal and a fifth node and having a control gate receiving said mode signal; and a sixth transistor of said second type having a current path between said fourth node and said fifth node and having a control gate receiving an inverse mode signal.

26. A method of producing burst address signals; comprising of:

decoding a plurality of address signals to produce a plurality of decoded address signals;

latching a portion of said address signals in an address logic control circuit so that said address logic control circuit outputs a control signal based on said portion of said address signal when a mode signals is provided with a first state; and producing a sequence of said burst address signals after said mode signal changes from said first state to a second state.

27. A semiconductor circuit comprising:

a means for decoding a plurality of address signals to produce a plurality of decoded address signals;

a means for generating a control signals in response to at least a portion of said address signals, said means for generating said control signal having at least one latch circuit;

a means for switching said decoded address signals and shifting said decoded address signals in response to said control signal to produce shifted decoded address signals; and a means for receiving and latching said output of the means for switching said decoded address signals.

* * * * *